(12) United States Patent
Nakako

(10) Patent No.: US 8,281,278 B2
(45) Date of Patent: Oct. 2, 2012

(54) SYSTEM AND METHOD FOR SUPPORTING DESIGN OF SEMICONDUCTOR INTEGRATED CIRCUIT INCLUDING PROCESSING SCAN CHAINS

(75) Inventor: Takahisa Nakako, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 259 days.

(21) Appl. No.: 12/709,924

(22) Filed: Feb. 22, 2010

(65) Prior Publication Data
US 2010/0218060 A1 Aug. 26, 2010

(30) Foreign Application Priority Data
Feb. 23, 2009 (JP) ................. 2009-038811

(51) Int. Cl.
G06F 17/50 (2006.01)
(52) U.S. Cl. ......... 716/136; 716/109; 716/132; 714/729
(58) Field of Classification Search .................. 716/109, 716/132, 136; 714/729
See application file for complete search history.

(56) References Cited

U.S. PATENT DOCUMENTS

| | | | | |
|---|---|---|---|---|
| 6,405,355 B1* | 6/2002 | Duggirala et al. | ............ | 716/122 |
| 6,539,536 B1* | 3/2003 | Singh et al. | .................... | 716/102 |
| 6,954,887 B2* | 10/2005 | Wang et al. | .................... | 714/729 |
| 7,188,286 B2* | 3/2007 | Dervisoglu et al. | .......... | 714/727 |
| 7,925,465 B2* | 4/2011 | Lin et al. | ........................ | 702/124 |
| 7,945,833 B1* | 5/2011 | Wang et al. | .................... | 714/729 |
| 7,962,822 B2* | 6/2011 | Wen et al. | ...................... | 714/738 |
| 2008/0195346 A1* | 8/2008 | Lin et al. | ...................... | 702/119 |
| 2010/0211839 A1* | 8/2010 | Almukhaizim et al. | ....... | 714/729 |

OTHER PUBLICATIONS

Laung-Terng Wang et al., System-On-Chip Test Architectures, Nanometer Design for Testability, Nov. 2007, pp. 318-321, Morgan Kaufmann Publishers.

* cited by examiner

Primary Examiner — Naum Levin
(74) Attorney, Agent, or Firm — Foley & Lardner LLP

(57) ABSTRACT

A design supporting system of a semiconductor integrated circuit, includes: a scan chain designing section configured to generate a scan chain of scan cells; a specific cell determining section configured to determine as specific scan cells, ones of the scan cells of the scan chain based on the number of gates to be driven when a data held by each of the specific scan cells changes on scan-inputting a pattern data from a scan-in side of the scan chain; and a reordering section configured to reorder the specific scan cells at positions closest to the scan-in side of the scan chain. In the first pattern data, a don't-care bit has a same bit data as that of a care bit.

8 Claims, 14 Drawing Sheets

Fig. 6

| SCAN CELL | 1 (FF1) | 2 (FF2) | 3 (FF3) | 4 (FF4) | 5 (FF5) | 6 (FF6) | 7 (FF7) | 8 (FF8) | SCAN OUT |
|---|---|---|---|---|---|---|---|---|---|
| CAPTURED | 0 | 1 | 0 | 1 | 0 | 1 | 0 | 1 | |
| SCAN SHIFT 1 | 1 | 0 | 1 | 0 | 1 | 0 | 1 | 0 | 1 |
| SCAN SHIFT 2 | 1 | 1 | 0 | 1 | 0 | 1 | 0 | 1 | 0 |
| SCAN SHIFT 3 | 1 | 1 | 1 | 0 | 1 | 0 | 1 | 0 | 1 |
| SCAN SHIFT 4 | 1 | 1 | 1 | 1 | 0 | 1 | 0 | 1 | 0 |
| SCAN SHIFT 5 | 0 | 1 | 1 | 1 | 1 | 0 | 1 | 0 | 1 |
| SCAN SHIFT 6 | | 0 | 1 | 1 | 1 | 1 | 0 | 1 | 0 |
| SCAN SHIFT 7 | 0 | 0 | 0 | 1 | 1 | 1 | 1 | 0 | 1 |
| SCAN SHIFT 8 | 0 | 0 | 0 | 0 | 1 | 1 | 1 | 1 | 0 |
| TOGGLE COUNT | 2 | 3 | 4 | 5 | 5 | 6 | 7 | 8 | |

←SCAN-IN SIDE    SCAN-OUT SIDE→

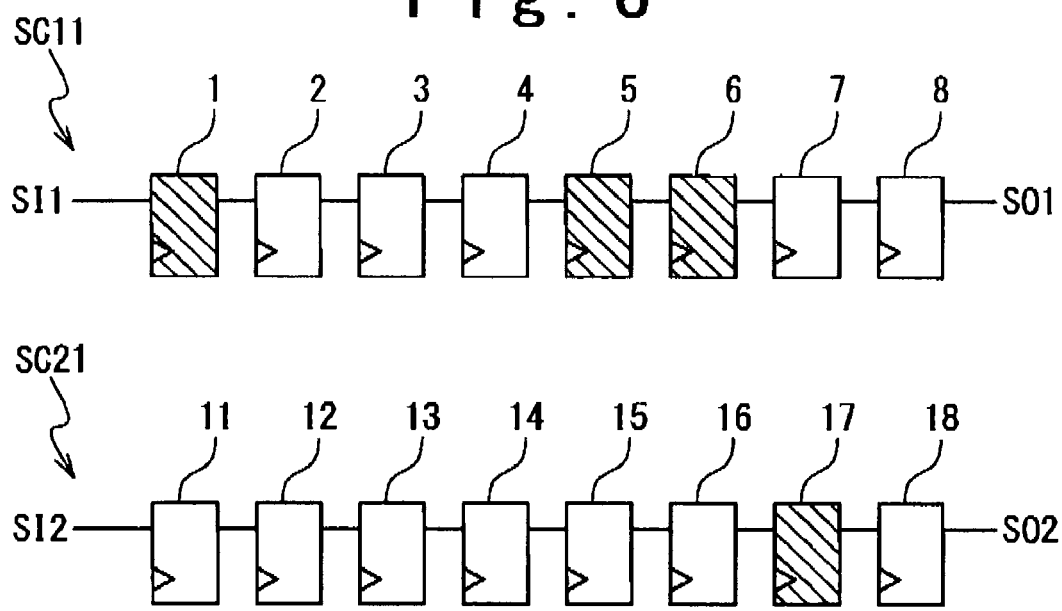
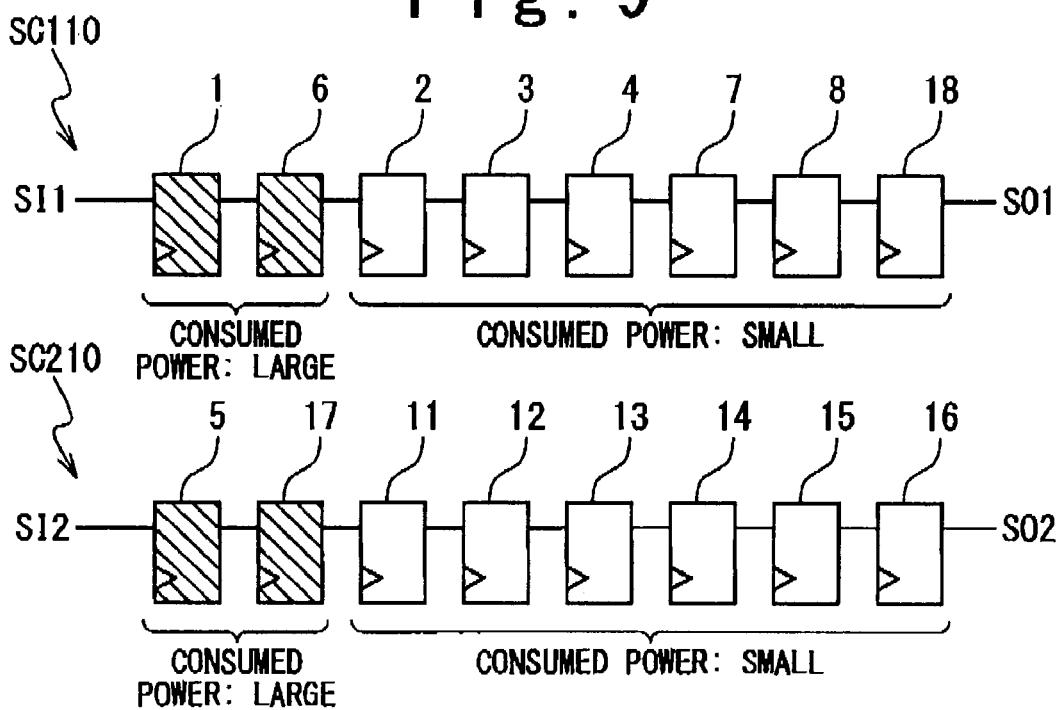

SYSTEM AND METHOD FOR SUPPORTING DESIGN OF SEMICONDUCTOR INTEGRATED CIRCUIT INCLUDING PROCESSING SCAN CHAINS

INCORPORATION BY REFERENCE

This patent application claims a priority on convention based on Japanese Patent Application No. 2009-038811. The disclosure thereof is incorporated herein by reference.

TECHNICAL FIELD

The present invention relates to a system and method for supporting design of a semiconductor integrated circuit, and more particularly relates to a system and method for supporting design of a semiconductor integrated circuit for a scan test, and the semiconductor integrated circuit.

BACKGROUND ART

A design technique is known in which a test circuit is incorporated at a design stage in advance to check whether or not a delay fault or a stuck-at fault has occurred in a product, after manufacture of a semiconductor integrated circuit. Such a design technique is called a Design for Testability (DFT).

A "scan design" is known as one scheme of the design for testability. According to the scan design, all or a part of flip-flops in a designed circuit is replaced by scan cells (also, to be referred to as scan flip-flops) and constitutes a scan chain (also, to be referred to as a scan path).

Referring to FIG. 1, a scan chain will be described. The scan chain is configured from using flip-flops FF1 to FF4 provided between combinational circuits C1 to C3 in the semiconductor integrated circuit. Specifically, an output terminal of each of the flip-flops FF1 to FF4 is connected with an input terminal of the next flip-flop through one of selectors (multiplexers) M1 to M4, and the respective flip-flops FF1 to FF4 function as scan cells 1 to 4. The scan cells 1 to 4 are connected in series and constitute a scan chain operating as a shift register. The scan chain captures a scan-in test pattern data to supply to a combinational circuit by a shift operation. In addition, the scan chain captures data D1 to D4 from the combinational circuits on the basis of a scan enable signal SE, and outputs the captured data by the shift operation.

A signal selecting operation of the selectors M1 to M4 is controlled based on the scan enable signal SE, which switches the operation between a capture operation (a data input operation) and the shift operation. For example, the scan cell 1 captures the data D1 from the combinational circuit C1 through the selector M1. The captured data D1 is shifted to the next-step scan cells 2, 3, and 4 in accordance with the scan-in data SI, and is retrieved outside as a scan-out data SO. The scan cells 2 to 4 operate in the same manner.

In the scan test, the test pattern data is supplied to the combinational circuit by the shift operation of the scan chain, and the output data of the combinational circuit is retrieved from the scan cell (flip-flop) through the capture operation. Next, the output data retrieved to the scan cell is outputted outside through the shift operation. By comparing the data retrieved in this manner (scanned-out data) with an expectation value, whether or not a logic circuit in a test target circuit is in a good state can be checked.

Referring to FIG. 2, details of operation of the scan test in a conventional technique will be described. FIG. 2 is a diagram showing an example of the scan chain. Here, the scan chain having eight scan cells 1 to 8 will be described as one example. At first, the test pattern data is set to (scanned in) the scan chain, and a response result is retrieved to (captured by) each of the scan cells 1 to 8.

The captured result is retrieved (scanned out) outside through the shift operation. In accordance with the shift operation in scanning-in or scanning-out the data, a data value retained in the scan cell varies (toggles). When the number of times of the toggling operation (toggling count) is large, power consumption amount increases. Accordingly, the toggling count can be reduced by setting the value of data scanned in the scan chain (scan-in data SI) to be adequate, and thus an increase of the power consumption amount can be suppressed.

As one example of the method of reducing the toggling count, a same-value-Fill method is known. The same-value-Fill method is a method of scanning-in a scan-in data of a pattern in which a don't-care bit is set to the same value as that of a care bit. Here, the care bit indicates a bit position corresponding to a scan cell necessary for fault detection in the pattern data. The same-value-Fill is sometimes called minimum transition fill, repeat fill, or adjacent fill.

For example, in a scan chain shown in FIG. 2, when fourth and eighth scan cells 4 and 8 from a scan-in side are used for the fault detection, a position of each of the cells on the pattern is set as the care bit. In this case, the pattern data is scanned-in in which the first and fifth bits are the care bits and the other bits are the don't-care bits. For example, when the data value of the first bit is "1" and the data value of the fifth bit is "0", the don't-care bits of the second to fourth bits are set to "1" which is same as that of the first bit, and the don't-care bits of the sixth to eighth bits are set to "0" which is same as that of the fifth bit. That is, the pattern data "11110000" is scanned-in.

When the pattern data is set to the scan cells 1 to 8 by using the same-value-Fill method, the same bit data is consecutively supplied to the scan cell through the shift operation. In this manner, the toggling count in the scan cell is reduced and the power consumption amount in the scan-in is suppressed. A method of reducing the toggling count using the same-value-Fill method is described, for example, in "SYSTEM ON CHIP TEST ARCHITECTURES" (MORGAN KAUFFMAN, NOV, 2007) by Lasing-Terng Wang, Charles E. Stroud, and Nur A. Touba.

Since a pattern of the scan-in data SI can be arbitrarily set by a user (a designer), the toggling count can be reduced by using the same-value-Fill method as described above. However, since the capture data is a random data that cannot be arbitrarily set, it is difficult to control the toggling count of the scan cell based on the scan-out data.

As described above, in the conventional technique, the power consumption amount in the scan-in can be reduced; however, it is difficult to reduce the power consumption amount in the scan-out for retrieving the captured data. To reduce the power consumption amount in the scan test, it is desired to reduce the power consumption amount in the scan-out.

SUMMARY OF THE INVENTION

In an aspect of the present invention, a design supporting method of a semiconductor integrated circuit, includes: generating a scan chain of scan cells; determining as specific scan cells, ones of the scan cells of the scan chain based on the number of gates to be driven when a data held by each of the specific scan cells changes on scan-inputting a pattern data from a scan-in side of the scan chain; and reordering the specific scan cells at positions closest to the scan-in side of the scan chain. In the first pattern data, a don't-care bit has a same bit data as that of a care bit.

In another aspect of the present invention, a design supporting system of a semiconductor integrated circuit, includes: a scan chain designing section configured to generate a scan chain of scan cells; a specific cell determining section configured to determine as specific scan cells, ones of the scan cells of the scan chain based on the number of gates to be driven when a data held by each of the specific scan cells changes on scan-inputting a pattern data from a scan-in side of the scan chain; and a reordering section configured to reorder the specific scan cells at position's closest to the scan-in side of the scan chain. In the first pattern data, a don't-care bit has a same bit data as that of a care bit.

In another aspect of a semiconductor integrated circuit according to the present invention, specific scan cells are arranged at positions closest to a scan-in side of a scan chain of scan cells. The specific scan cells are determined from the scan cells of the scan chain based on the number of gates to be driven when a data held by each of the specific scan cells changes on scan-inputting a pattern data from the scan-in side of the scan chain. In the first pattern data, a don't-care bit has a same bit data as that of a care bit.

A design supporting method of a semiconductor integrated circuit, and a semiconductor integrated circuit according to the present invention can reduce the power consumption amount in the scan test.

BRIEF DESCRIPTION OF THE DRAWINGS

The above and other objects, advantages and features of the present invention will be more apparent from the following description of certain embodiments taken in conjunction with the accompanying drawings, in which:

FIG. 6 is a diagram showing one example of transition of a data value retained in scan cells;

FIG. 8 is a diagram showing one example of scan chains, before being reordered by the design supporting system according to the present invention;

FIG. 9 is a diagram showing one example of the scan chains reordered by the design supporting system according to the present invention;

DESCRIPTION OF THE EMBODIMENTS

Hereinafter, a design supporting method of a semiconductor integrated circuit and a design support system according to the present invention will be described in detail with reference to the attached drawings. In the present invention, a scan chain used for a scan test in an MUX (multiplexer) scanning method is designed on a semiconductor integrated circuit.

Figure 3:
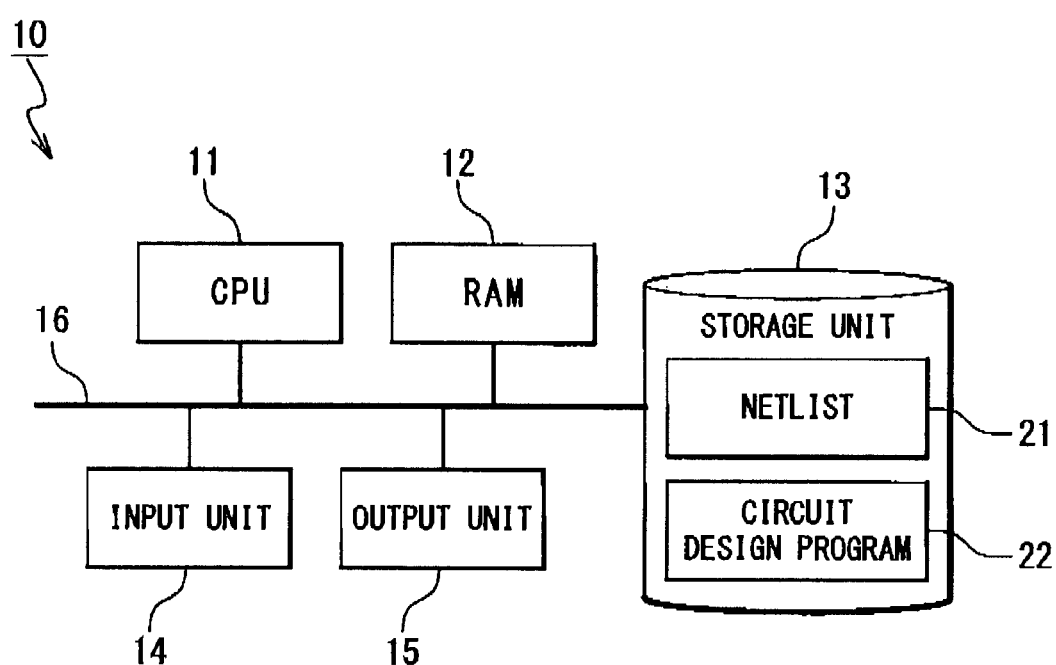
FIG. 3 is a diagram showing a configuration of a design supporting system according to an embodiment of the present invention.

FIG. 3 is a block diagram showing a configuration in a design supporting system 10 according to the present invention. The design supporting system 10 includes a CPU 11, a RAM 12, a storage unit 13, an input unit 14, and an output unit 15 that are connected to each other through a bus 16. The storage unit 13 is an external storage unit exemplified by a hard disk, a memory, or the like. In addition, the input unit 14 supplies various types of data to the CPU 11 and the storage unit 13 by an operation of a keyboard, a mouse, or the like by a user. The output unit 15 is exemplified by a monitor or a printer, and outputs a layout result of the semiconductor device outputted from the CPU 11 to the user.

In response to the input from the input unit 14, the CPU 11 executes a circuit design program 23 which has been loaded from a recording medium into the storage unit 13, and carries out a design for testability (in this example, a scan chain). In this case, various types of data and programs from the storage unit 13 are temporarily stored in the RAM 12, and the CPU 11 executes various types of processes based on the program by using data in the RAM 12.

The storage unit 13 stores a netlist 21 and a circuit design program 22. The netlist 21 includes an element card describing a connection relation, type and size of each of elements of a design object circuit (including the number of elements); a parameter of a device model of a nonlinear active element, such as a diode and a transistor, of the elements of the circuit; condition data (initial values and the like) used for controlling an analysis method of the circuit.

Figure 4:
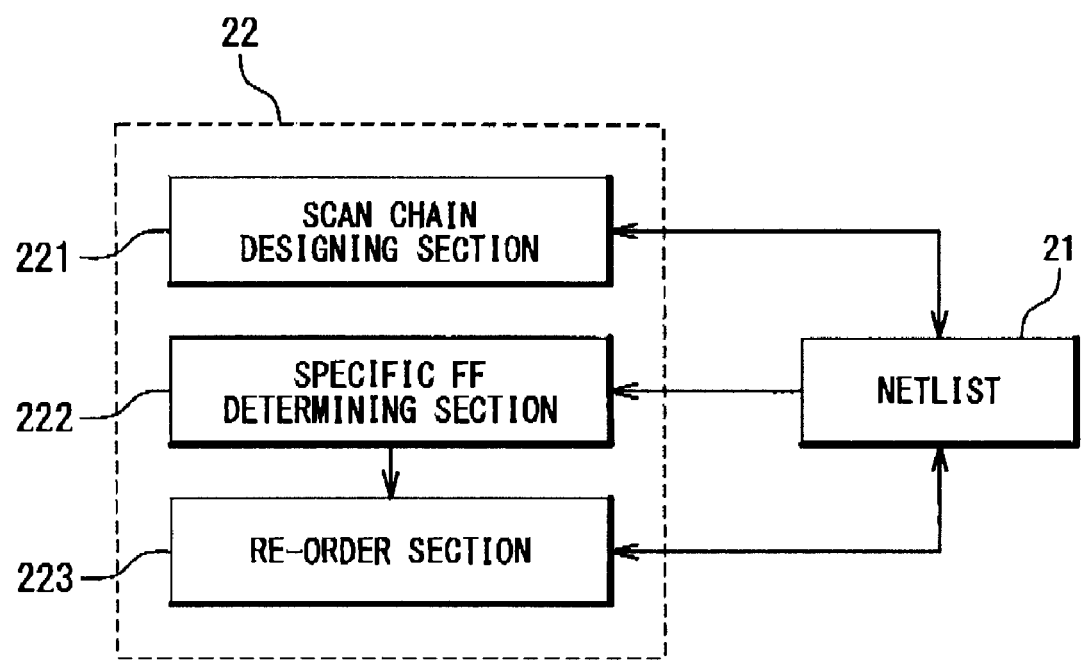
FIG. 4 is a diagram showing functional sections realized based on a circuit design program according to the present invention.

The CPU 11 executes the circuit design program 22 to realize function sections as a tool for generating the scan chain on the semiconductor integrated circuit to be designed. Specifically, a scan chain designing section 221, a large power consumed FF determining section 222, and a reordering section 223 shown in FIG. 4 are realized through the execution of the circuit design program 22 by the CPU 11.

The scan chain designing section 221 inserts a selector (a multiplexer), a scan-in terminal, a scan-out terminal, and the like in the netlist 21 of a gate level in the course of or after logic synthesis. The scan chain designing section 221 generates the scan chain by using the same method and condition as those of the conventional technique (for example, an interconnection length between scan cells), and updates the netlist 21 with the generated scan chain. In addition, the scan chain designing section 221 automatically generates a test pattern to be supplied when the scan test is performed, from the netlist 21.

The large power consumed FF determining section 222 searches the scan cells (flip-flops) of the generated (or preliminarily prepared) scan chain, and determines large power consumed FFs (flip-flops). Here, the large power consumed FF shows a scan cell in which a power consumption amount of the circuit significantly increases when retained data changes. For example, the scan cell that the number of gates to be driven in response to the change of retained data is equal to or more than a reference value, is selected as the large power consumed FF from among the scan cells of the scan chain. That is, the scan cell in which the power consumption amount per once toggling operation is large is defined as the large power consumed FF.

Figure 5:
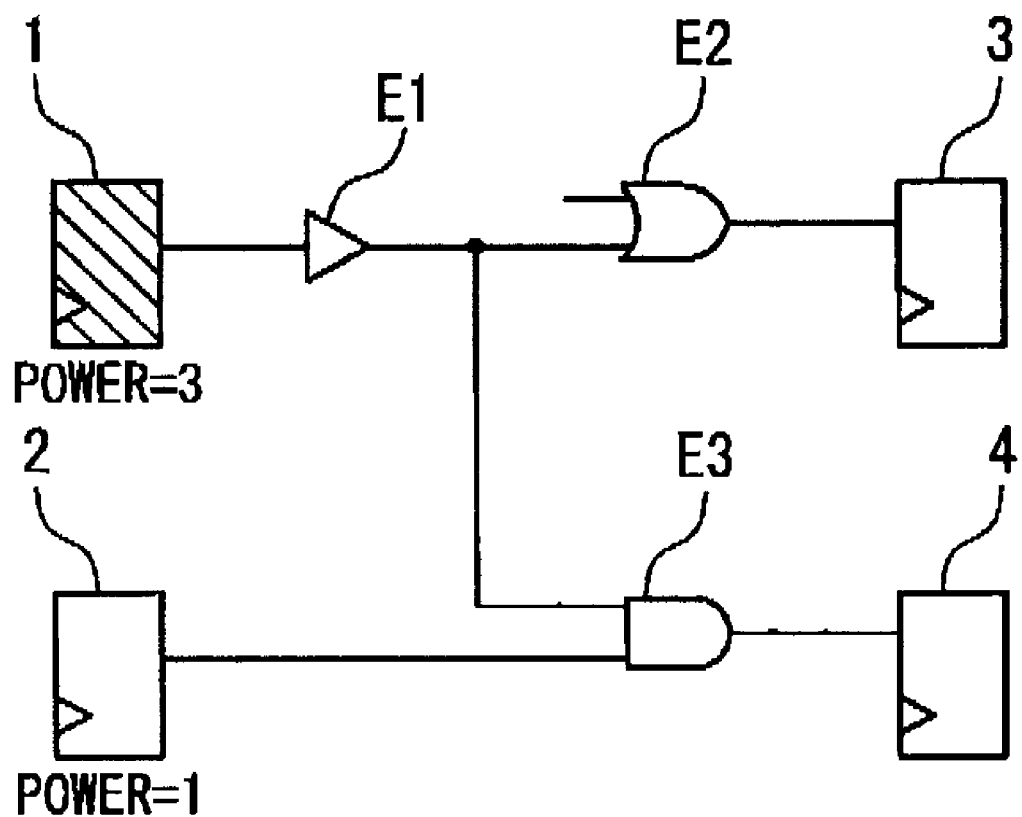
FIG. 5 is a diagram showing a large power consumed FF in the present invention.

As one example of the method of determining the large power consumed FF, a method is known of counting the number of gates (hereinafter to be referred to as a power) included in a fan-out cone of the scan cell and determining the scan cell including gates equal to or more than the reference value, as the large power consumed FF. Specifically, referring to FIG. 5, the gates included in the fan-out cone of the scan cell 1 are three gates E1, E2, and E3, which is represented as "the power=3". Also, the gate included in the fan-out cone of the scan cell 2 is one gate E3, which is represented as "the power=1". Here, when the reference value used to determine the large power consumed FF is set to "the power=2", the scan cell 1 is selected as the large power consumed FF. Or, when the reference value used to determine the large power consumed FF is set to the largest power among all scan cells 1 to 4 in the scan chain, the scan cell 1 having the largest power is selected as the large power consumed FF. Moreover, the reference value used to determine the large power consumed FF may be set for each flip-flop group that operates in response to the same clock signal. For example, when the reference value is set to the largest power among all scan cells in the flip-flop group, the scan cell having the largest power in the flip-flop group is selected as the large power consumed FFs.

The reordering section 223 changes arrangement of the scan cells in the generated (or preliminarily prepared) scan chain. Specifically, the reordering section 223 refers to the netlist 21 to which the scan chain is added, changes the arrangement of the scan cells so that the large power consumed FF can be arranged on the scan-in side in the scan chain, and updates the netlist 21.

Figure 1:
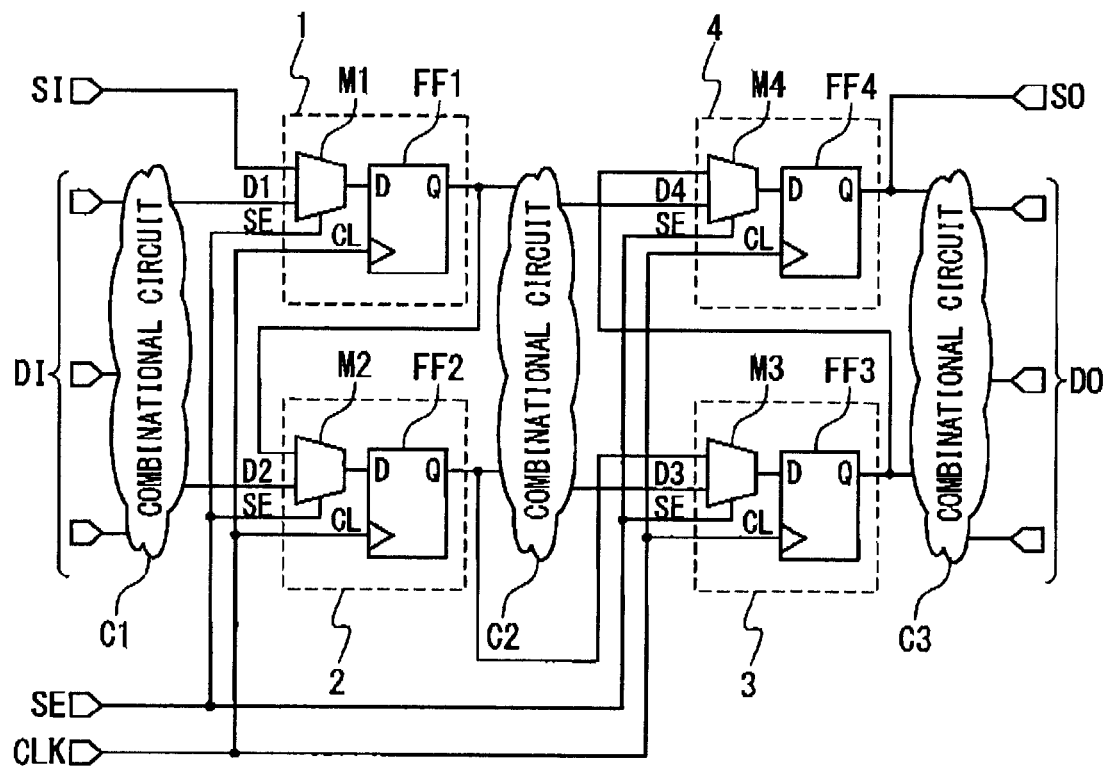
FIG. 1 is a diagram showing one example of a typical scan chain in a semiconductor integrated circuit.
Figure 2:
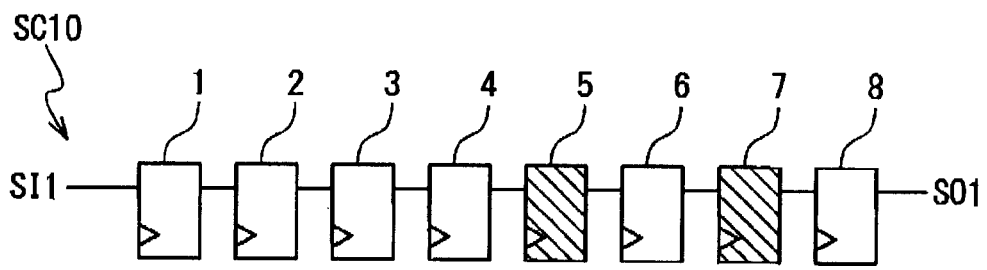
FIG. 2 is a diagram showing one example of the scan chain.

FIG. 6 is a diagram showing one example of transition of data values retained in the scan cells 1 to 8 in the scan test performed to a scan chain SC 10 shown in FIG. 2. Referring to FIG. 6, an effect of arranging the large power consumed FF on the scan-in side will be described. Here, it is assumed that the scan cells 1, 2, 3, 4, 5, 6, 7, and 8 have captured data "0", "1", "0", "1", "0", "1", "0", and "1" in sequence.

In a case of retrieving the data "01010101" captured by the scan cells 1 to 8, the data retained in the scan cells 1 to 8 is shifted and is outputted as scan-out data "10101010" in accordance with the scan data SI. Here, it is preferred to retrieve the captured data by using the same-value-Fill method in order to reduce the power consumption amount in the scan-in. In the case of retrieving the captured data in accordance with the same-value-Fill method, the same data is continuously supplied to the scan cell in the shifting operation. For this reason, the number of times of the toggling operation (toggling count) in the scan cell can be reduced. In the example shown in FIG. 6, positions on the pattern corresponding to the fourth and eighth scan cells 4 and 8 from the scan-in side are set as care bits in the scan chain shown in FIG. 2, and pattern data "11110000" is scanned-in.

The number of scan cells on the input side of the scan chain is smaller than that on the scan-out side. For this reason, in a case of the scan-in, the number of captured data supplied to the scan cells on the scan-in side through the shifting operation is smaller than that on the scan-out side. Meanwhile, in a case of the scan-in and the scan-out, the number of scan-in data SI supplied to the scan-in side through the shifting operation is larger than that on the scan-out side.

The toggling count in shifting the scan-in data SI can be reduced by using the same-value-Fill method. Meanwhile, unlike the scan-in data SI that can be arbitrarily set by the user, the captured data is a random value, and accordingly it is difficult to control the toggling count in the shifting the captured data.

As described above, the toggling count on the scan-in side is smaller than the toggling count on the scan-out side by using the same-value-Fill method. In particular, since the capture data is not supplied from another scan cell to the scan cell 1 closest to the scan-in side and only the scan-in data SI is supplied to the scan cell 1, the toggling count is determined based on only the data retained by itself and the scan-in data SI. Accordingly, the toggling count of the scan cell 1 closest to the scan-in side can be made the smallest by setting a pattern of the scan-in data SI to an adequate pattern. In the example shown in FIG. 6, while the toggling counts of the scan cells 1, 2, and 3 on the scan-in side are two times, three times, and four times in turn, the toggling counts of the scan cells 6, 7, and 8 on the scan-out side are six times, seven times, and eight times, and it could be found that the toggling count on the scan-in side is smaller than that on the scan-out side.

Figure 7:
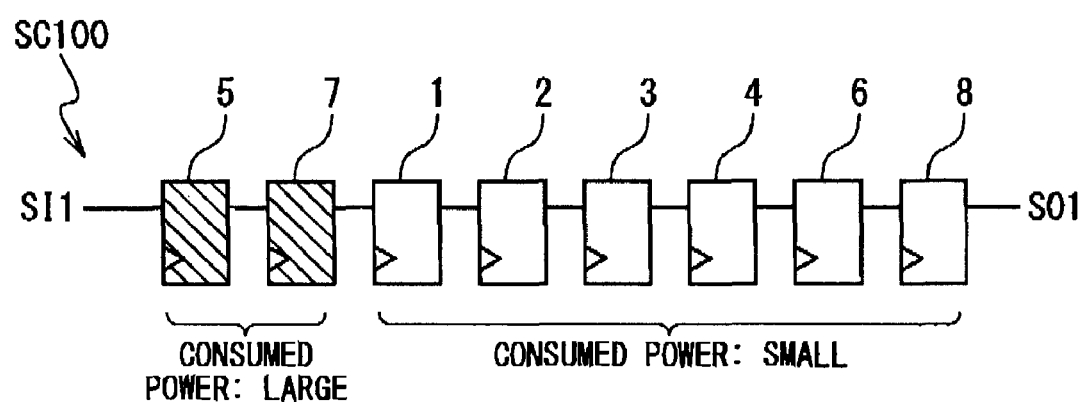
FIG. 7 is a diagram showing one example of scan cells reordered by the design supporting system according to the present invention.

In the present invention, the large power consumed FF is arranged on the scan-in side in the scan chain by the reordering section 223. That is, the large power consumed FF is arranged at a position at which the toggling count is small. For example, when the scan cells 5 and 7 of the scan chain SC10 shown in FIG. 2 are the large power consumed FFs, the scan cells 5 and 7 are arranged on the scan-in side, as shown a scan chain SC100 in FIG. 7, and other scan cells 1 to 4, 6, and 8 are reordered so as to be in the latter portion.

In the case of the scan chain SC10 shown in FIG. 2, the large power consumed FFs are arranged as fifth (the toggling count is 5) and seventh (the toggling count is 7) scan cells from the scan-in side. That is, a total of toggling counts of the large power consumed FFs in the scan chain is "5+7=12". Meanwhile, in the case of the scan chain SC100 shown in FIG. 7, the large power consumed FFs are arranged as first (the toggling count is 2) and second (the toggling count is 3) scan cells from the scan-in side. That is, the total of toggling counts of the large power consumed FFs is "2+3=5", and the number of driving gates becomes small.

As described above, in the present invention, the power consumption amount of the whole semiconductor integrated circuit in the scan-out (retrieving of the captured data) can be reduced by arranging the large power consumed FF having large power consumption amount per single toggling operation on the scan-in side in which the toggling count is small.

In addition, the large power consumed FF determining section 222 may select the scan cell in which a power consumption amount of the semiconductor integrated circuit per single toggling operation is equal to or smaller than a reference value. In this case, the reordering section 223 arranges the scan cell having the small power consumption amount per single toggling operation on the scan-out side in which the toggling count is large. Through the above-mentioned changing of arrangement positions of the large power consumed FFs, the power consumption amount of the whole semiconductor integrated circuit in the scan-out (the retrieving of the captured data) can be further reduced.

Referring to FIGS. 8 to 18, examples of a method of changing the arrangement position of the large power consumed FF will be described.

Reorder Example 1

FIG. 8 is a diagram showing two scan chains SC11 and SC21 designed by the scan chain designing section 221. Here, the large power consumed FF determining section 222 selects first, fifth, sixth scan cells 1, 5, and 6 from the scan-in side (SI1) in the scan chain SC11 and a seventh scan cell 17 from the scan-in side (SI2) in the scan chain SC21 as the large power consumed FFs. In addition, it is assumed that the two scan chains SC11 and SC21 operate in synchronization with a same clock signal.

The reordering section 223 generates two scan chains SC110 and SC210 shown in FIG. 9 by rearranging the scan cells in the scan chains SC11 and SC21. It is preferred that when there are a plurality of scan chains using the same operation clock signal, the reordering section 223 can interchange the scan cells between the scan chains. In this case, it is preferred to equalize the number of the large power consumed FFs in the respective scan chains so as to arrange as many large power consumed FFs as possible on the scan-in side.

Three large power consumed FFs exist in the scan chain SC11, and one large power consumed FF exists in the scan chain SC21. In addition, since the scan chains SC11 and SC21 operate in response with the same clock signal, the scan cells can be interchanged. Accordingly, the reordering section 223 arranges the scan cells 1 and 6 that are the large power consumed FFs, at positions closest to the scan-in side (SI1) of the scan chain SC110, and arranges the scan cells 5 and 17 that are the large power consumed FFs, at positions closest to the scan-in side (SI2) of the scan chain SC210. In this case, since the scan cell 5 has been arranged on the scan chain SC210, a scan cell of a small power (in this example, a scan cell 18) is arranged on the scan chain SC110.

Reorder Example 2

Figure 10:
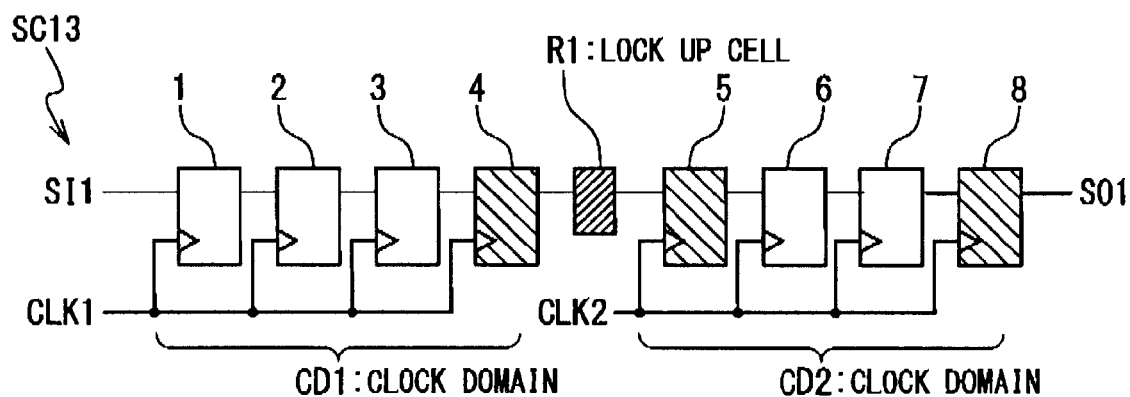
FIG. 10 is a diagram showing one example of the scan chain before being reordered by the design supporting system according to the present invention.
Figure 11:
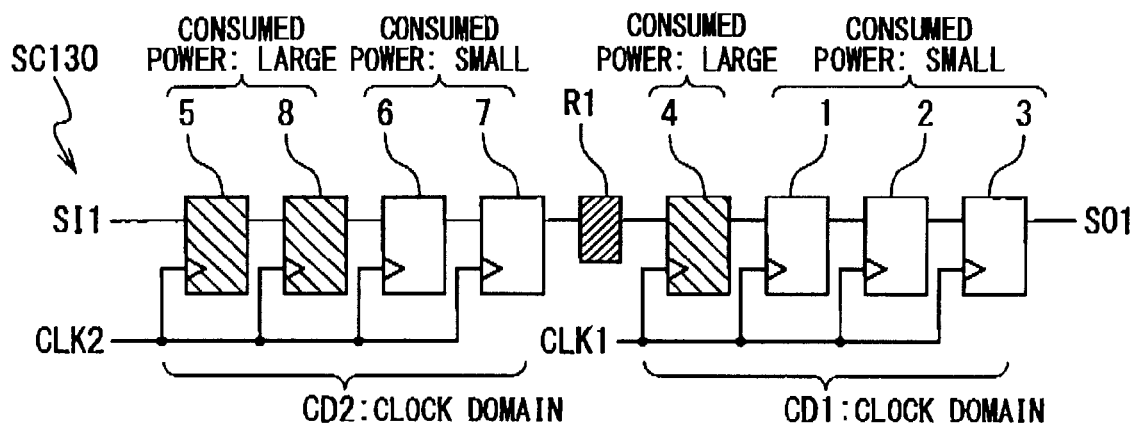
FIG. 11 is a diagram showing one example of the scan chain reordered by the design supporting system according to the present invention.

FIG. 10 is a diagram showing a scan chain SC13 designed by the scan chain designing section 221. The scan chain SC13 includes a clock domain CD1 (scan cells 1 to 4) operating in response to a clock signal CLK1 and a clock domain CD2 (scan cells 5 to 8) operating in response to a clock signal CLK2. A lock-up cell R1 is inserted between the clock domain CD1 and the clock domain CD2. Here, the lock-up cell R1 is a latch or a flip-flop to be inserted between clock domains of a same clock phase for shift timing assurance.

Here, the large power consumed FF determining section 222 selects the fourth, fifth, and eighth scan cells 4, 5, and 8 from the scan-in side (SI1) in the scan chain SC130 as the large power consumed FFs. The reordering section 223 generates the scan chain SC130 shown in FIG. 11 by rearranging the scan cells in the scan chain SC13. When a plurality of clock domains exist in one scan chain, the reordering section 223 changes the arrangement of the large power consumed FFs in consideration of interchanging of order of the clock domains. Here, when the numbers of scan cells in the clock domains are the same, the clock domain having the larger number of the large power consumed FFs is arranged on the scan-in side. In this manner, more large power consumed FFs can be arranged on the scan-in side in which the toggling count is small.

The numbers of scan cells in the clock domain CD1 and the clock domain CD2 in the scan chain SC13 are the same. Accordingly, the reordering section 223 arranges the clock domain CD2 having the large number of the large power consumed FFs on the scan-in side and arranges the scan cells 5 and 8 as the large power consumed FFs at positions closest to the scan-in side in the clock domain CD2. Accordingly, the scan cells 5 and 8 are arranged at positions closest to the scan-in side (SI1) of the scan chain SC130. In addition, the reordering section 223 arranges the clock domain CD1 having the smaller number of the large power consumed FFs on the scan-out side and arranges the scan cell 4 as the large power consumed FF at a position closest to the scan-in side in the clock domain CD1.

Reorder Example 3

Figure 12:
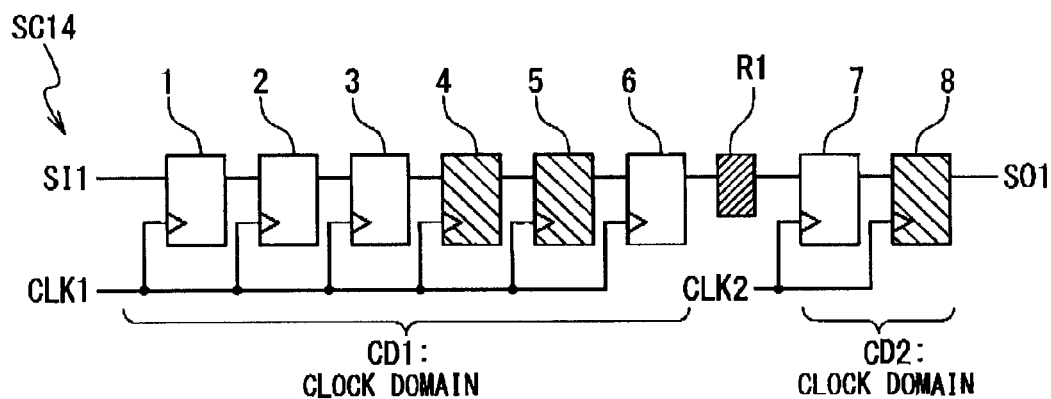
FIG. 12 is a diagram showing one example of a scan chain before being reordered by the design supporting system according to the present invention.

FIG. 12 is a diagram showing a scan chain SC14 designed by the scan chain designing section 221. The scan chain SC14 includes a clock domain CD1 (scan cells 1 to 6) operating in response to a clock signal CLK1 and a clock domain CD2 (scan cells 7 to 8) operating in response to a clock signal CLK2. A lock-up cell R1 is inserted between the clock domain CD1 and the clock domain CD2.

Here, the large power consumed FF determining section 222 selects the fourth, fifth, and eighth scan cells 4, 5, and 8 from the scan-in side (SI1) in the scan chain SC14 as the large power consumed FFs.

Figure 13:
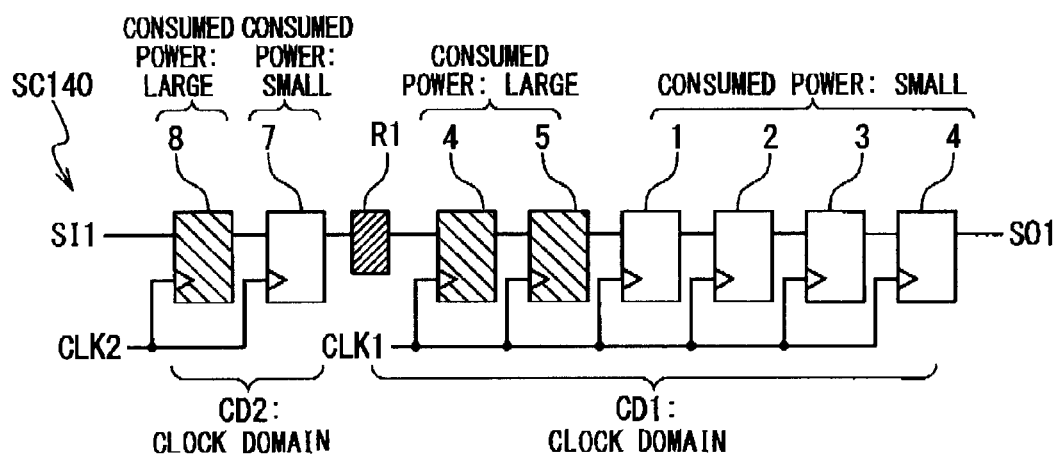
FIG. 13 is a diagram showing one example of the scan chain reordered by the design supporting system according to the present invention.

The reordering section 223 generates the scan chain SC140 shown in FIG. 13 by rearranging the scan cells in the scan chain SC14. When a plurality of clock domains exist in one scan chain, the reordering section 223 changes the arrangement of the large power consumed FFs in consideration of interchanging of order of the clock domains. Here, when the numbers of the scan cells in the clock domains are different from each other, there is a case that the power consumption amount can be reduced more when the clock domain having the smaller number of the scan cells is arranged on the scan-in side. For example, referring to FIG. 12, there are many scan cells 1, 2, 3, and 6 other than the large power consumed FFs in the clock domain CD1 in the scan chain SC14. In this case, if the clock domain CD1 is arranged on the scan-in side, many scan cells having the small power consumption amount are arranged on the scan-in side, and the large power consumed FFs in the clock domain CD2 are far from the scan-in side. Consequently, the large power consumed FFs are arranged at a position at which the toggling count is large. On the other hand, since the number of the scan cell 7 other than the large power consumed. FF in the clock domain CD2 is one and small, the large power consumed FFs in the clock domain CD1 are arranged at a position far from the scan-in side by one scan cell even when the clock domain CD2 is arranged on the scan-in side. That is, it is preferred to interchange the positions of the clock domains and the positions of the large power consumed FFs in consideration of arrangement of many large power consumed FFs as close to the scan-in side as possible.

As shown in FIG. 13, the reordering section 223 arranges the clock domain CD2 on the scan-in side, and arranges the scan cell 8 as the large power consumed FF at a position closest to the scan-in side in the clock domain CD2. In this manner, the scan cell 8 is arranged at a position closest to the scan-in side (SI1) of the scan chain SC140. In addition, the reordering section 223 arranges the clock domain CD1 on the scan-out side, and arranges the scan cells 4 and 5 as the large power consumed FFs at positions closest to the scan-in side in the clock domain CD2.

Reorder Example 4

Figure 14:
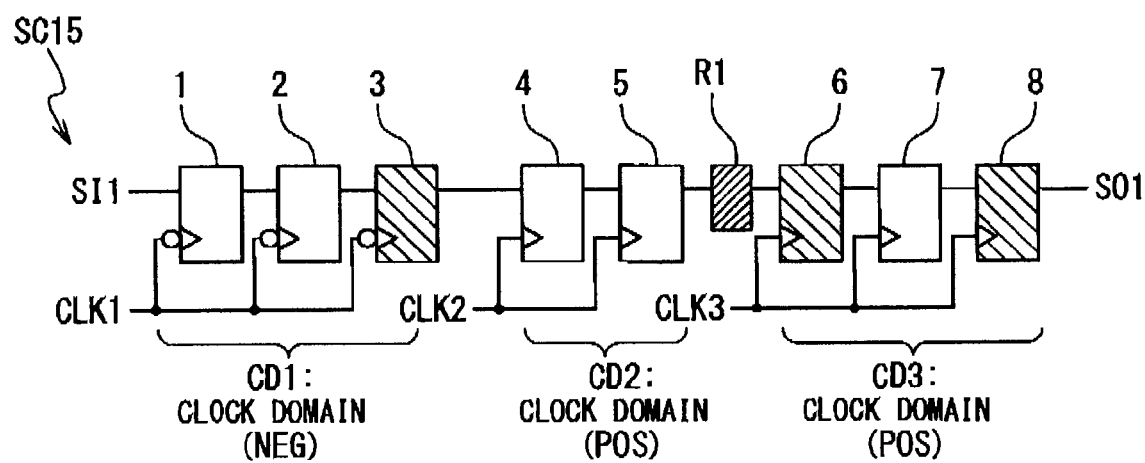
FIG. 14 is a diagram showing one example of a scan chain before being reordered by the design supporting system according to the present invention.

FIG. 14 is a diagram showing a scan chain SC15 designed by the scan chain designing section 221. The scan chain SC15 includes a clock domain (NEG) CD1 (scan cells 1 to 3) operating at a falling edge of the clock signal CLK1, a clock domain (POS) CD2 (scan cells 4 and 5) operating at a rising edge of the clock signal CLK2, and a clock domain (POS) CD3 (scan cells 6 to 8) operating at the rising edge of the clock signal CLK3. The lock-up cell R1 is inserted between the clock domain (POS) CD2 and the clock domain (POS) CD3.

Here, the large power consumed FF determining section 222 selects the third, sixth, and eighth scan cells 3, 6, and 8 from the scan-in side (SI1) in the scan chain SC15 as the large power consumed FFs. When the scan cells (POS) operating at the rising edge of the clock signal and the scan cell (NEG) operating at the falling edge are mixed in the scan chain, it is preferred that the reordering section 223 can interchange the order of the scan cells (NEG) and the scan cells (POS). However, some of the currently-used DFT/ATPG tools are not allowed to have a configuration arranging the scan cells (POS) on the scan-in side and the scan cells (NEG) on the scan-out side. In this case, as shown in FIG. 15A, the reordering section 223 interchanges only the clock domains (POS) as needed without interchanging the clock domain (NEG) CD1 and the clock domains (POS).

Figure 15A:
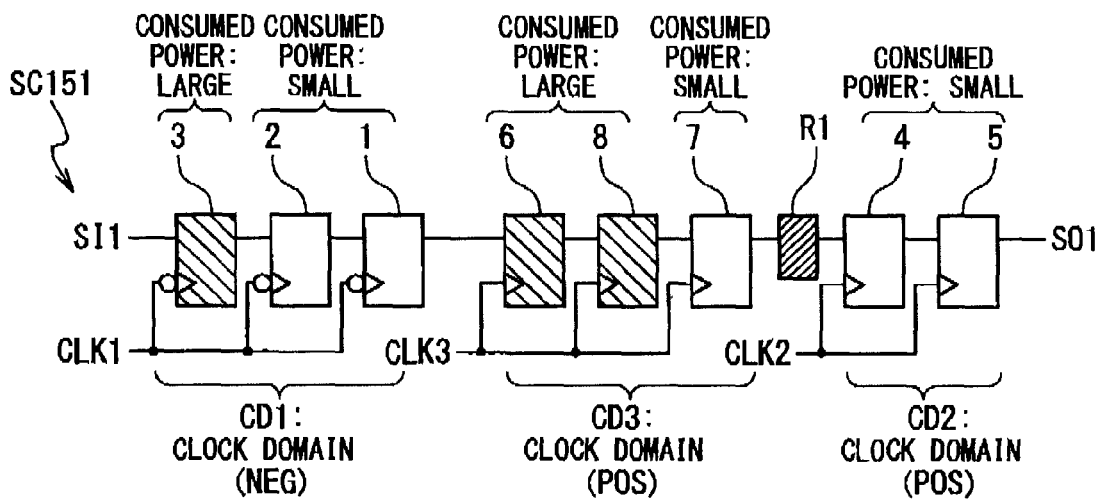
FIG. 15A is a diagram showing one example of the scan chain reordered by the design supporting system according to the present invention.

Here, the reordering section 223 rearranges the scan cells in the scan chain SC15 to generate a scan chain SC151 shown in FIG. 15A. Referring to FIG. 15A, since any large power consumed FF does not exist in the clock domain (POS) CD2, the reordering section 223 interchanges positions between the clock domain (POS) CD2 and the clock domain (POS) CD3 having two large power consumed FFs. In addition, the scan cells 6 and 8 are arranged at positions closest to the scan-in side of the clock domain (POS) CD3. Moreover, the reordering section 223 arranges the scan cell 3 at a position closest to the scan-in side of the clock domain (NEG) CD1 without changing the position of the clock domain (NEG) CD1. In this manner, the scan cell 3 is arranged at the position closest to the scan-in side (SI1) of the scan chain SC151.

Figure 15B:
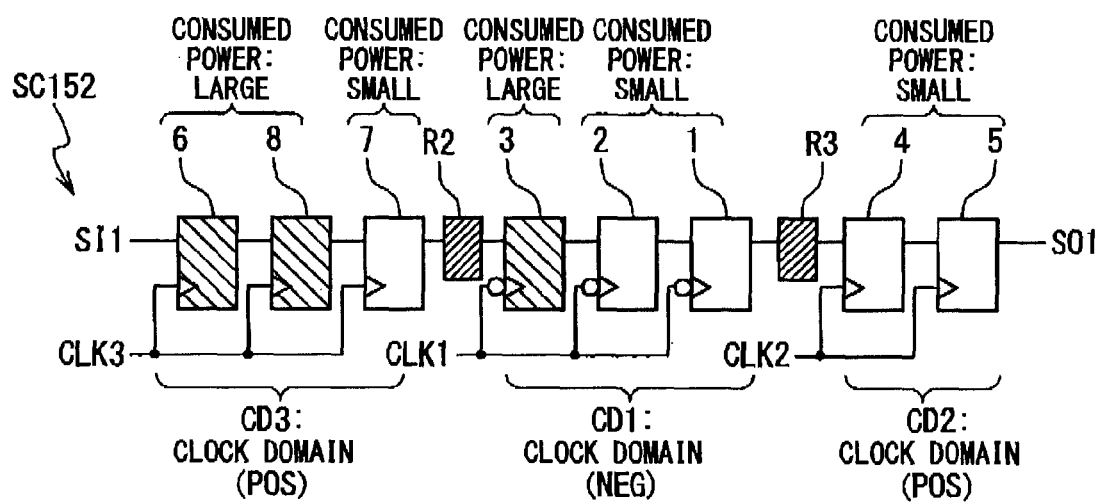
FIG. 15B is a diagram showing one example of the scan chain reordered by the design supporting system according to the present invention.

Meanwhile, when the reordering section 223 has a function of interchanging the order of the clock domain (NEG) and the clock domain (POS), the reordering section 223 rearranges the clock domains in the scan chain SC15 to generate a scan chain SC152 shown in FIG. 15B. Referring to FIG. 15B, since any large power consumed FF does not exist in the clock domain (POS) CD2, the reordering section 223 arranges the clock domain (POS) CD2 at a position closest to the scan-out side in the scan chain SC152. In addition, the numbers of scan cells in the clock domain (NEG) CD1 and the clock domain (POS) CD3 in the scan chain SC 15 are the same. Accordingly, the reordering section 223 arranges the clock domain (POS) CD3 having the larger number of the large power consumed FFs on the scan-in side, and arranges the scan cells 6 and 8 at positions closest to the scan-in side in the clock domain (POS) CD3. In this manner, the scan cells 6 and 8 are arranged at the positions closest to the scan-in side (SI1) of the scan chain SC152. In addition, the reordering section 223 arranges the clock domain (NEG) CD1 having the smaller number of the large power consumed FFs on the scan-out side with respect to the clock domain (POS) CD3, and arranges the scan cell 3 as the large power consumed FF at a position closest to the scan-in side in the clock domain (NEG) CD1. Furthermore, new lock-up cells R2 and R3 for assuring the phase of the clock signal are inserted between the clock domain (POS) CD3 and the clock domain (NEG) CD1 and between the clock domain (NEG) CD1 and the clock domain (POS) CD3.

As described above, according to the present invention, the scan cells can be reordered at the positions in which the power consumption amount can be reduced most under the restriction given to the reordering section 223.

Reorder Example 5

Figure 16:
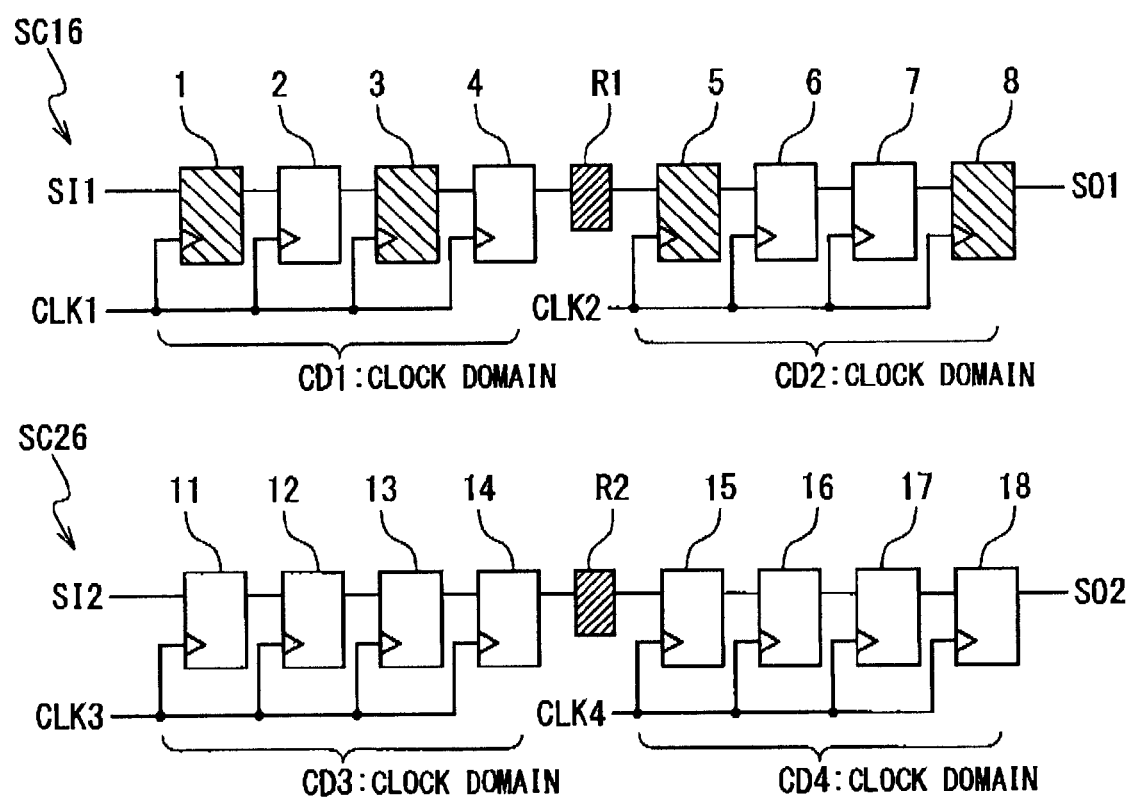
FIG. 16 is a diagram showing one example of the scan chains before being reordered by the design support device according to the present invention.
Figure 17:
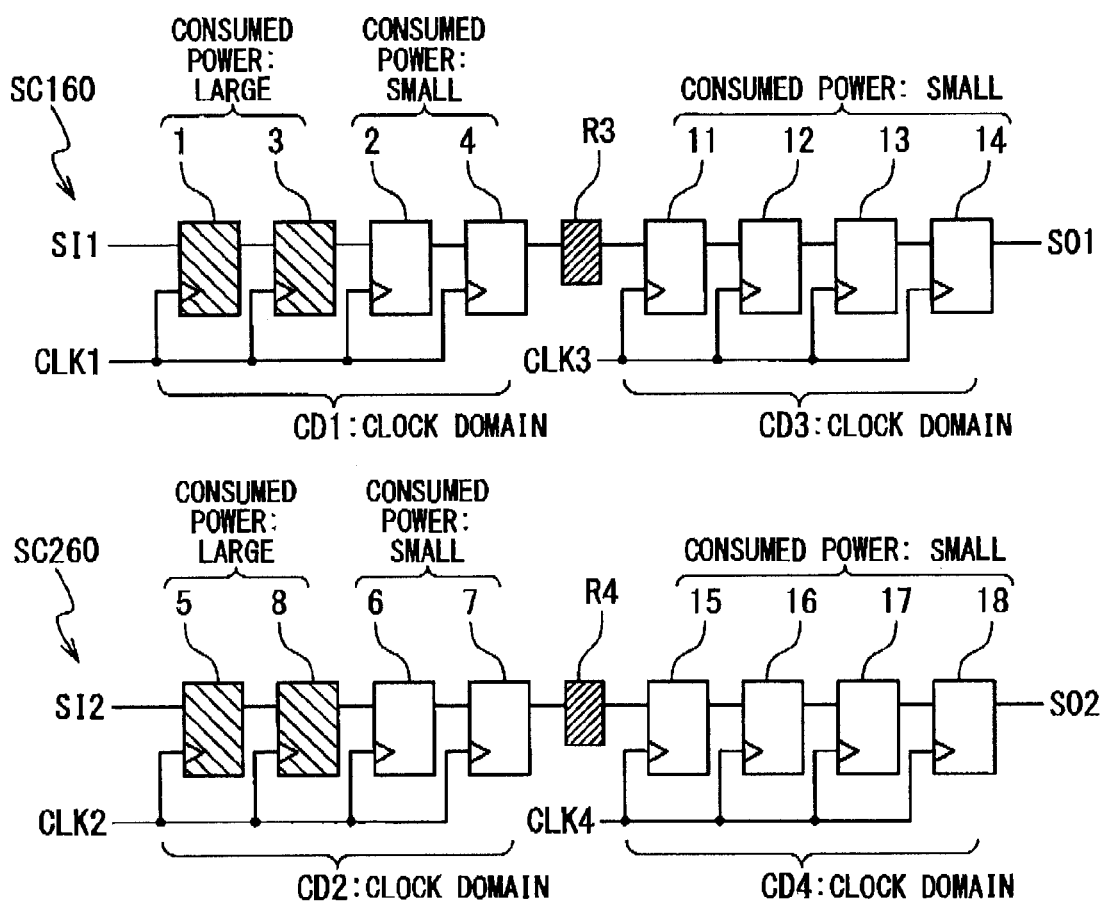
FIG. 17 is a diagram showing one example of the scan chains reordered by the design supporting system according to the present invention.

FIG. 16 is a diagram showing two scan chains SC16 and SC26 designed by the scan chain designing section 221. The scan chain SC16 includes a clock domain CD1 (scan cells 1 to 4) operating in response to a clock signal CLK1 and a clock domain CD2 (scan cells 5 to 8) operating in response to a clock signal CLK2. A lock-up cell R1 is inserted between the clock domain CD1 and the clock domain CD2. In addition, the scan chain SC26 includes a clock domain CD3 (scan cells 11 to 14) operating in response to a clock signal CLK3 and a clock domain CD4 (scan cells 15 to 18) operating in response to a clock signal CLK4. A lock-up cell R2 is inserted between the clock domain CD3 and the clock domain CD4.

Here, the large power consumed FF determining section 222 selects the first, third, fifth, and eighth scan cells 1, 3, 5, and 8 from the scan-in side (SI1) in the scan chain SC16 as the large power consumed FFs. The reordering section 223 generates two scan chains SC160 and SC260 shown in FIG. 17 by rearranging the scan cells in the scan chains SC16 and SC26. It is preferred that the reordering section 223 can interchange the clock domains between a plurality of the scan chains. It is preferred to equalize the number of the large power consumed FFs arranged in the respective scan chains by arranging the clock domain including the large power consumed FFs on the scan-in side of another scan chain so as to arrange as many large power consumed FFs as possible on the scan-in side.

Four large power consumed FFs exist in the scan chain SC16, and no large power consumed FF exists in the scan chain SC26. In this case, by interchanging clock domains between the scan chains and interchanging the scan cells in the clock domain, the large power consumed FFs are arranged at positions closest to the scan-in side in the scan chains. Here, the reordering section 223 arranges the clock domain CD2 on the scan-in side of the scan chain SC260 and arranges the clock domain CD3 on the scan-out side of the scan chain SC160. In this case, in the scan chains SC16 and SC26 before the reordering, the lock-up cells R1 and R2 inserted between the clock domain CD1 and the clock domain CD2 and between the clock domain CD3 and the clock domain CD4 are changed to adequately-configured lock-up cells R3 and R4 inserted between the clock domain CD1 and the clock domain CD3 and between the clock domain CD2 and the clock domain CD4. In addition, the reordering section 223 arranges the scan cells 1 and 3 as the large power consumed FFs at positions closest to the scan-in side (SI1) of the clock domain CD1, and arranges the scan cells 5 and 8 as the large power consumed FFs at positions closest to the scan-in side (SI2) of the clock domain CD2. In this manner, the scan cells 1 and 3 as the large power consumed FFs are arranged at positions closest to the scan-in side (SI1) of the scan chain SC160, and the scan cells 5 and 8 as the large power consumed FFs are arranged at positions closest to the scan-in side (SI2) of the scan chain SC210.

Reorder Example 6

In the above-mentioned example, the reordering is performed by separating the scan cells into two types, i.e. the large power consumed FFs and other flip-flops (scan cells). However, the present invention is not limited to this, and the scan cells may be arranged from the scan-in side in descending order of the power consumption amount (for example, in descending order of the number of gates in the fan-out cone). In this case, in consideration of an effect of the reorder according to a conventional technique to shorten an interconnection length, arrangement of the scan cells may be determined by using an evaluation function of the power consumption amount (for example, the number of gates in the fan-out cone); and the interconnection length.

Figure 18:
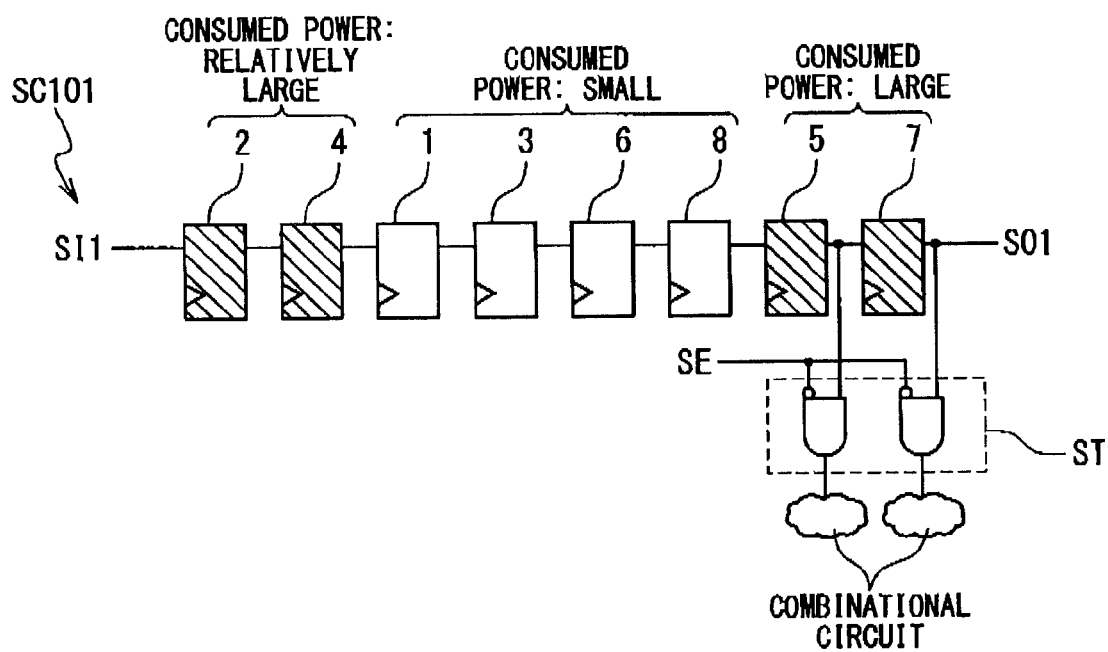
FIG. 18 is a diagram showing one example of a scan chain reordered by the design supporting system according to the present invention.

FIG. 18 is a diagram showing a scan chain SC101 configured by rearranging the scan chain SC10 shown in FIG. 2 by the reordering section 223. Here, a stop circuit ST is connected to the scan cells 5 and 7 as the large power consumed FFs. The stop circuit ST stops operations of the scan cells 5 and 7 in accordance with the scan enable signal SE. In this manner, the large power consumed FFs do not operate in the scan test to reduce the power consumption amount. In this case, the large power consumed FF determination 222 selects the scan cells having the large power consumption amount (the power consumption amount of the semiconductor integrated circuit per single toggling operation) from among the scan cells 1 to 4, 6, and 8 as a second large power consumed FF. The reordering section 223 arranges the scan cells 2 and 4 selected as the second large power consumed FFs at positions closest to the scan-in side in the scan chain SC101. Since the scan cells 5 and 7 connected to the stop circuit ST are recognized as the scan cells having the small power consumption amount in the scan chain SC101, the scan cells 5 and 7 are arranged at positions closest to the scan-out side in the scan chain SC101.

As described above, the design supporting method of the semiconductor integrated circuit, and the semiconductor integrated circuit according to the present invention can reduce the power consumption amount in the scan test by arranging the scan cells having the large power consumption amount due to the toggling operation at positions in which the toggling count is small.

The embodiments of the present invention have been described in detail above; however, a specific configuration is not limited to the above-mentioned embodiments, and modifications within the scope of the present invention are included in the present invention. The above-mentioned reorder examples can be combined and applied without departing from technical consistency.

What is claimed is:

1. A design supporting method of a semiconductor integrated circuit, comprising:
    generating, via a computer, a scan chain of scan cells;
    determining, via the computer, as specific scan cells, ones of said scan cells of said scan chain based on the number of gates to be driven when a data held by each of said specific scan cells changes on scan-inputting a first pattern data from a scan-in side of said scan chain; and
    reordering, via the computer, said specific scan cells at positions closest to the scan-in side of said scan chain,
    wherein in the first pattern data, a don't-care bit has a same bit data as that of a care bit.

2. The design supporting method according to claim 1, wherein said determining comprises:
    determining said specific scan cells, each of which has a larger number of gates to be driven than a reference number.

3. The design supporting method according to claim 1, wherein said generating further comprises:
    generating an additional scan chain of scan cells, and said reordering comprises:
    reordering said specific scan cells at positions closest to the scan-in side of said scan chain and said additional scan chain as evenly as possible; and
    moving some of said scan cells of said additional scan chain to said scan chain such that the number of scan cells in said scan chain and the number of scan cells in said additional scan chain are as even as possible.

4. The design supporting method according to claim 1, wherein said scan chain comprises first and second clock domain scan chain portions, which are connected in this order, and the number of specific scan cells in said first clock domain scan chain portion is more than in said second clock domain scan chain portion, and
    said reordering comprises:
    interchanging positions of said first and second clock domain scan chain portions; and
    reordering said specific scan cells at positions closest to the scan-in side of said second and first clock domain scan chain portions.

5. A design supporting system of a semiconductor integrated circuit, comprising:
    a scan chain designing section configured to generate a scan chain of scan cells;
    a specific cell determining section configured to determine as specific scan cells, ones of said scan cells of said scan chain based on the number of gates to be driven when a data held by each of said specific scan cells changes on scan-inputting a first pattern data from a scan-in side of said scan chain; and
    a reordering section configured to reorder said specific scan cells at positions closest to the scan-in side of said scan chain,
    wherein in the first pattern data, a don't-care bit has a same bit data as that of a care bit.

6. The design supporting system according to claim 5, wherein said specific cell determining section determines said specific scan cells, each of which has a larger number of gates to be driven than a reference number.

7. The design supporting system according to claim 5, wherein said scan chain designing section further generates an additional scan chain of scan cells, and
    said reordering section reorders said specific scan cells at positions closest to the scan-in side of said scan chain and said additional scan chain as evenly as possible, and moves some of said scan cells of said additional scan chain to said scan chain such that the number of scan cells in said scan chain and the number of scan cells in said additional scan chain are as even as possible.

8. The design supporting system according to claim 5, wherein said scan chain comprises first and second clock domain scan chain portions, which are connected in this order, and the number of specific scan cells in said first clock domain scan chain portion is more than in said second clock domain scan chain portion, and
    said reordering section interchanges positions of said first and second clock domain scan chain portions, and reorders said specific scan cells at positions closest to the scan-in side of said second and first clock domain scan chain portions.

* * * * *